United States Patent [19]
Wang et al.

[11] Patent Number: 5,747,882
[45] Date of Patent: May 5, 1998

[54] DEVICE INCLUDING MEANS FOR PREVENTING TUNGSTEN SILICIDE LIFTING, AND METHOD OF FABRICATION THEREOF

[75] Inventors: Hsingya Arthur Wang, Saratoga; Mark T. Ramsbey, Sunnyvale; Yu Sun, Saratoga, all of Calif.

[73] Assignee: Advanced Micro Devices, Inc., Sunnyvale, Calif.

[21] Appl. No.: 744,962

[22] Filed: Nov. 7, 1996

[51] Int. Cl.[6] .......................... H01L 23/48; H01L 23/52; H01L 29/40
[52] U.S. Cl. .......................... 257/768; 257/754; 257/755
[58] Field of Search .................... 257/768, 754, 257/755, 757, 769

[56] References Cited

U.S. PATENT DOCUMENTS

| | | |
|---|---|---|
| 4,476,482 | 10/1984 | Scott et al. ............................ 257/755 |
| 4,503,601 | 3/1985 | Chiao . |
| 4,700,215 | 10/1987 | McPherson ........................... 257/755 |
| 4,855,798 | 8/1989 | Imamura et al. ..................... 257/755 |
| 4,879,586 | 11/1989 | Brostrom et al. . |
| 4,910,578 | 3/1990 | Okamoto .............................. 257/757 |
| 5,072,275 | 12/1991 | Vora ..................................... 257/755 |
| 5,381,040 | 1/1995 | Sun et al. ............................. 257/754 |
| 5,416,352 | 5/1995 | Takada ................................. 257/755 |
| 5,447,875 | 9/1995 | Moslehi . |
| 5,563,093 | 10/1996 | Koda et al. . |

*Primary Examiner*—Sara W. Crane
*Assistant Examiner*—Phat X. Cao
*Attorney, Agent, or Firm*—Skjerven, Morrill, MacPherson, Franklin & Friel; Edward C. Kwok

[57] ABSTRACT

In a semiconductor device, a layer of nitrogen doped polysilicon is applied to a gate oxide in turn provided on a semiconductor body, and then a silicide film is applied to the polysilicon layer. The nitrogen in the polysilicon layer inhibits growth of native oxide on the polysilicon layer prior to the application of silicide, and at subsequent high temperature processing steps, so that the problem of the silicide layer lifting from the polysilicon layer due to this native oxide growth is avoided during subsequent high temperature processing of the device.

4 Claims, 2 Drawing Sheets

DEVICE INCLUDING MEANS FOR PREVENTING TUNGSTEN SILICIDE LIFTING, AND METHOD OF FABRICATION THEREOF

FIELD OF THE INVENTION

This invention relates to semiconductor devices, and more particularly, to a semiconductor device which utilizes a silicide layer on a polysilicon layer.

BACKGROUND OF THE INVENTION

In the formation of a gate of a semiconductor device including a polysilicon layer and silicide thereover (commonly used in flash memory devices), it is important that the CVD or sputtered silicide layer adhere strongly to the layer of polysilicon therebeneath during continuing process steps through completion of the device, as explained below.

With reference to FIG. 1, a prior art semiconductor device 10 is shown subsequent to growth of field oxide regions 12, 14 and gate oxide 16 on a semiconductor body 18 and having a layer of polysilicon 20 thereon as is well known.

Prior to the application of a layer of silicide, a thin layer of native oxide 22 (FIG. 1) has grown on the polysilicon layer 20 as the structure is held at room temperature for a period of time awaiting application of the silicide layer.

After application of the silicide layer 24, and upon further fabrication of the device at relatively high temperatures, the silicide layer 24 can lift from the polysilicon layer 22, causing a void 26 (as shown in FIG. 3 for example at the gate area), and causing failure of the affected silicon wafer lots.

In an attempt to deal with this problem, HF vapor may be applied to the exposed native oxide 22 in an attempt to remove it to the extent possible prior to application of the silicide layer 24 to the polysilicon layer 20. However, this has not proven completely effective, and further processing at relatively high temperatures can cause such voids to occur even with minimal oxide 22 on the polysilicon layer 20.

SUMMARY OF THE INVENTION

After formation of the gate oxide of a device, a layer of nitrogen doped polysilicon is applied to the gate oxide, and then a metal (for example, tungsten or cobalt) silicide film is applied to the polysilicon layer. The nitrogen in the polysilicon layer inhibits growth of native oxide on the polysilicon layer prior to the application of silicide, so that the problem of the silicide layer lifting from the polysilicon layer is avoided during subsequent high temperature processing of the device.

DESCRIPTION OF THE PREFERRED EMBODIMENTS

Figure 1:
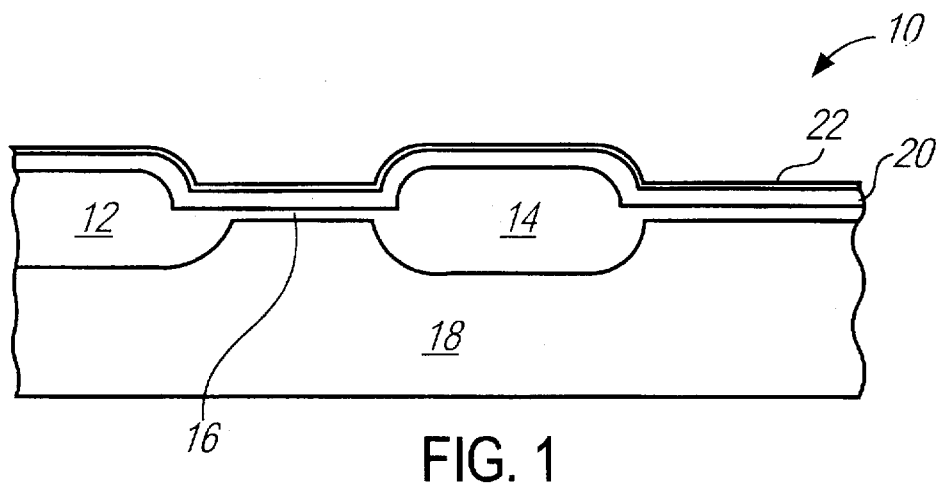
FIGS. 1–3 are sectional views showing prior art process steps for providing a silicide layer over a polysilicon layer of a device.
Figure 2:
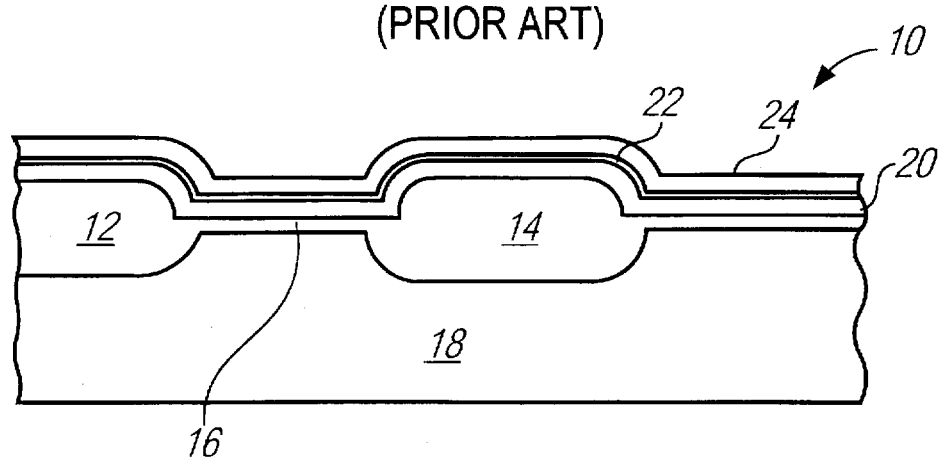
Figure 3:
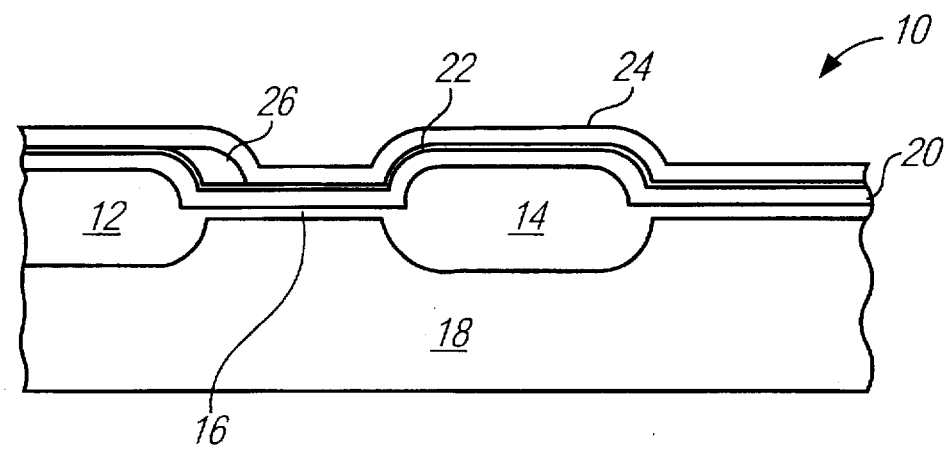
Figure 4:
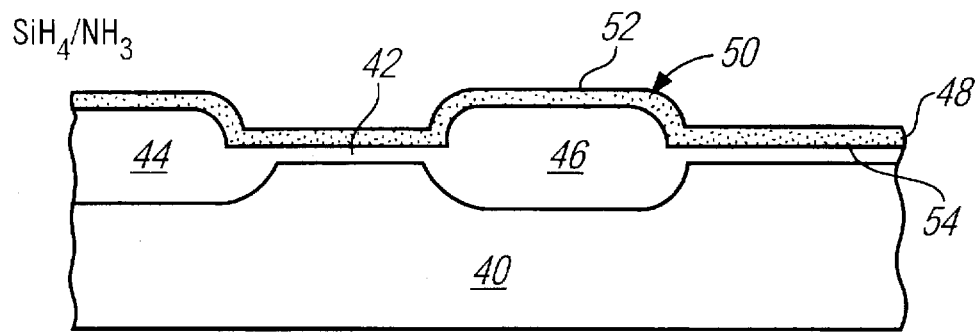
FIGS. 4–7 are sectional views showing fabrication of devices in accordance with the present invention.
Figure 5:
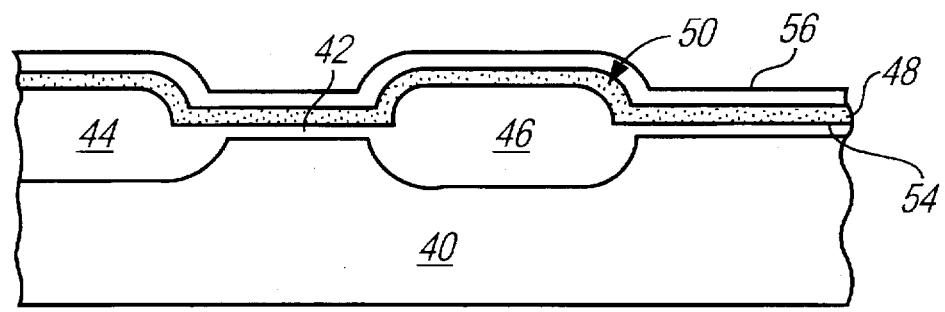

With reference to FIG. 4, a silicon body 40 is shown, having gate oxide 42 thereon and field oxide regions 44, 46 grown therein as is well known. Next, a polysilicon layer 48 is deposited on the gate oxide 42 and field oxide regions 44, 46, in the presence of $SiH_4/NH_3$ gas mixture, so that the polysilicon layer 48 becomes doped with nitrogen 50. This nitrogen doping as shown in FIGS. 4 and 5 takes place along the surface 52 of the polysilicon layer 48 which is opposite that surface 54 in contact with the oxide 42, 44, 46, and extends only partially through the polysilicon layer 48. In fact, the depth of nitrogen doping 50 from that surface 52 can be very small, i.e., for example, less than or equal to 20 Å.

Upon application of metal (for example, tungsten or cobalt) silicide layer 56 over and in contact with the polysilicon layer 48 by CVD or sputtering, such nitrogen 50 in the polysilicon layer greatly reduces native surface oxide formation on the polysilicon layer 48 while the device is at room temperature and awaits further process steps. In fact, the native oxide growth on polysilicon layer 48 is reduced to a sufficient degree so as to avoid lifting of the subsequently applied silicide film during subsequent high temperature process steps, which might further oxidize the polysilicon layer 48.

Figure 6:
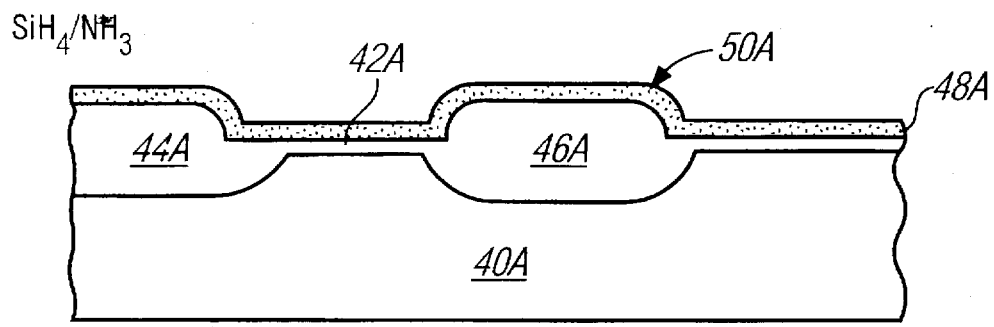
Figure 7:
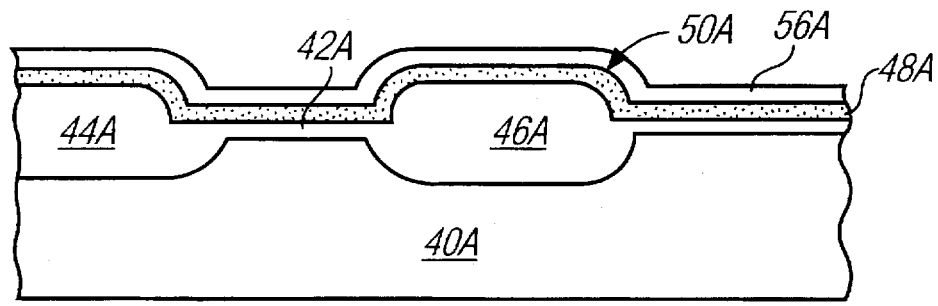

With reference to FIGS. 6 and 7, the method and structure are the same as that shown in FIGS. 4 and 5 and described above, except that the polysilicon layer 48A applied over the gate oxide 42A and field oxide regions 44A, 46A is doped entirely through with nitrogen 50A during depositing thereof by being in the presence of $SiH_4/NH_3$ gas mixture. Again, the nitrogen 50A in the polysilicon layer 48A reduces surface oxide formation on the polysilicon layer 48A to the point where the subsequent silicide layer 56A applied to the polysilicon layer 48A does not lift during subsequent high temperature process steps.

Nitrogen may be introduced into the polysilicon by several methods including ion implantation or a subsequent anneal in a nitrogen species ($N_2O$, NO, $NH_3$, etc.) after polysilicon deposition and even after the gate has been patterned and defined by etching away some of the polysilicon.

This invention also applies to any application of a silicide over a silicon based layer including amorphous silicon or polysilicon layers used for electrical interconnection on the control gate of a flash memory device. This silicon based layer can be undoped, n-type doped or p-type doped.

What is claimed is:

1. A semiconductor device comprising:

a semiconductor body;

an oxide layer on the semiconductor body;

a nitrogen doped silicon-based layer on the oxide layer; and a silicide layer over and in contact with the doped silicon-based layer;

wherein only a portion of the silicon-based layer is doped adjacent the surface thereof near the silicide layer.

2. The device of claim 1 wherein the silicide layer is tungsten silicide.

3. The device of claim 1 wherein the silicide layer is cobalt silicide.

4. The device of claim 1 wherein the portion of the silicon-based layer is doped to a depth less than or equal to 20 Å from the surface of the silicon-based layer near the silicide layer.

* * * * *